United States Patent [19]

Zumsteg

[11] 4,415,870

[45] Nov. 15, 1983

[54] OSCILLATOR CIRCUIT WITH DIGITAL TEMPERATURE COMPENSATION

[75] Inventor: Alphonse Zumsteg, Solothurn, Switzerland

[73] Assignee: Societe Suisse pour l'Industrie Horlogere Management Services SA, Bienne, Switzerland

[21] Appl. No.: 218,405

[22] Filed: Dec. 19, 1980

[30] Foreign Application Priority Data

Jan. 10, 1980 [CH] Switzerland .......................... 157/80

[51] Int. Cl.$^3$ .......................... H03B 5/04; H03B 5/32; H03L 1/02
[52] U.S. Cl. ...................................... 331/176; 331/17; 331/25; 331/37; 331/46; 331/158
[58] Field of Search ................. 331/37, 46, 47, 116 R, 331/158, 162, 176, 18, 25, 17; 368/159

[56] References Cited

U.S. PATENT DOCUMENTS

| | | | |
|---|---|---|---|
| 3,978,650 | 9/1976 | Hashimoto et al. | 331/176 X |
| 4,148,184 | 4/1979 | Akahane et al. | 331/1 R X |
| 4,159,622 | 7/1979 | Akahane | 331/176 X |

FOREIGN PATENT DOCUMENTS

| | | | |
|---|---|---|---|
| 2249377 | 5/1975 | France . | |
| 54-35768 | 3/1979 | Japan . | |
| 2004155 | 3/1979 | United Kingdom | 331/176 |

OTHER PUBLICATIONS

Akahane, "New Twin Quartz System Revolutionizes Timekeeping Accuracy", *JEE*, vol. 16, No. 154, (Oct. 1979), pp. 24–27.

Effenberger. "Digitale Temperaturkompensation Von Schwingquartz-Oszillatoren Mit Automatischem Frequenzabgleich", *Jahrbuch der Deutschen Gesellschaft fur Chronometric*, vol. 28, (1977).

*Primary Examiner*—Siegfried H. Grimm
*Attorney, Agent, or Firm*—Wender, Murase & White

[57] ABSTRACT

An oscillator circuit having a digital temperature compensation circuit which contains two low frequency quartz oscillators, a beat frequency generator and a correction circuit and a logic circuit selectively controlling an addition circuit. The beat frequency generator receives the frequencies generated by the low frequency oscillators. The difference between the low frequencies is fed into the correction circuit which in turn cooperates with the logic circuit. The beat frequency generator is controlled by a high frequency oscillator having an integrated RC circuit and the correction circuit has a PROM in which the correction functions are stored. The selectively controlled addition circuit acts on the output signal of the first oscillator and corrects the frequency thereof. An oscillator circuit connected in such a manner requires no pre-selection of the quartz crystals in pairs and the correction may be effected by influencing the high frequency oscillator, whereby a high degree of accuracy may be obtained.

5 Claims, 3 Drawing Figures

OSCILLATOR CIRCUIT WITH DIGITAL TEMPERATURE COMPENSATION

BACKGROUND OF THE INVENTION

The present invention relates to an oscillator circuit having a low frequency quartz oscillator with digital temperature compensation by means of a second low frequency quartz oscillator which has a different temperature inversion point, and having a temperature compensation circuit which contains a beat frequency generator and a correction circuit.

Such an oscillator is proposed and described in the Proceedings of the 32nd Annual Symposium on Frequency Control, 31.5.-2.7.1978, page 403. Thus, two low frequency oscillators are used with a frequency of 32 kHz, usual for watch circuits, and having an as uniform as possible quadratic temperature coefficient and different inversion temperatures.

While such a temperature compensation in an ideal theoretical case would appear to permit a temperature compensation sufficient for all practical cases, the method described therein in reality has some disadvantages which are founded on the spread of the parameters of the quartz oscillators and the integrated circuits used. Thus, between the theoretically attainable accuracy of the ideal case and the practical situation, there is a considerable gap and the selection of pairs of quartz crystals is required. Therefore it is an object of the present invention to provide digital temperature compensation which, without considerable expenditure, and without selecting the quartz crystals in pairs, attains a greater accuracy.

SUMMARY OF THE INVENTION

According to the present invention there is provided an oscillator circuit having a low-frequency oscillator, with digital compensation by means of a second low-frequency quartz oscillator, which has a different temperature inversion point, and a temperature compensation circuit which contains a beat frequency generator and a corrction circuit, wherein the beat frequency generator is controlled by an independent high frequency oscillator and the series connected correction circuit has a PROM in which the correction functions are stored.

BRIEF DESCRIPTION OF THE DRAWINGS

The invention will be described further, by way of example, with reference to the accompanying drawings, in which.

DESCRIPTION OF THE PREFERRED EMBODIMENT

Two quartz oscillators, as quoted in the said literature, with a uniform nominal frequency and displaced temperature inversion points and with uniform parabolic temperature coefficients, permit an ideal temperature compensation, since:

$$f_1(T) = f_{10}(1 + \beta_1(T - T_1)^2)$$

and $$f_2(T) = f_{20}(1 + \beta_2(T - T_2)^2)$$

applies, whereby $T_1$, $T_2$ are the inversion temperatures, $f_{10}$, $f_{20}$ the nominal frequencies at the inversion temperatures; and $\beta_1, \beta_2 = -3.6 \times 10^{-8}/(° C.)^2$, the quadratic or parabolic temperature coefficients; and it being assumed that the two parabolic coefficients are equal $= \beta$.

Figure 2:
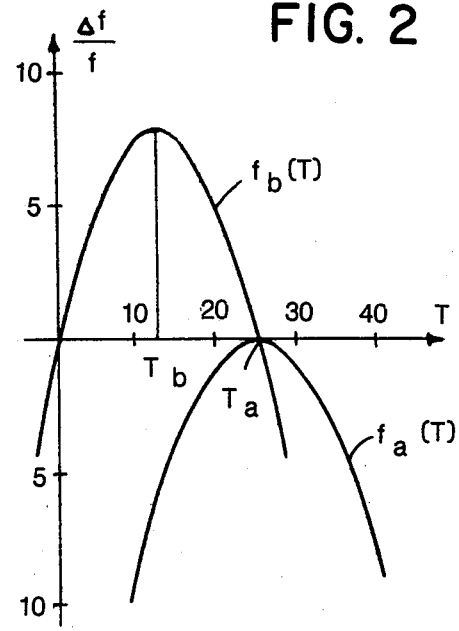
FIG. 2 shows the parabolic temperature behaviour of two low frequency oscillators in a particular arrangement.

FIG. 2 shows such an ideal temperature behavior of two equal quartz oscillators, whereby $f_a(T)$ and $T_a$ represent parameters of $f_1$ and $f_b(T)$ and $T_b$ represent parameters of $f_2$.

Resulting therefrom as the difference $$f_1 - f_2 \approx 2\beta T(T_1 = T_2)f_N + C,$$

whereby $f_N \approx f_{10} \approx f_{20}$ and the function $T^2$ is neglected. The difference therefore is a linear function of the temperature. It is possible to square this difference electronically, to multiply with a suitable constant and add the result to the frequency of the first oscillator.

It is therefore readily seen that $$f(T) = f_1(T) + k(f_2(T) - f_1(T))^2$$

constitutes an ideal temperature compensation, if $$k = \frac{-1}{4\beta(T_1 - T_2)^2 f_N} \text{ and } f_{20} = \frac{f_{10}}{1 + \beta(T_1 - T_2)^2}.$$

The above-mentioned case is simple to realise, yet the accuracy gained therewith is very low, which among other things is to be attributed to the unavoidable scattering of the parameters of the quartz oscillators. It is therefore necessary to select the quartz crystals in pairs in order to obtain the same values for the parabolic coefficients. This selection of pairs is necessary, since with a deviation of $\beta$ by 10%, which occurs in practice, the gain in accuracy, relative to an oscillator circuit without temperature compensation, amounts at the most to a factor 2.

Figure 1:
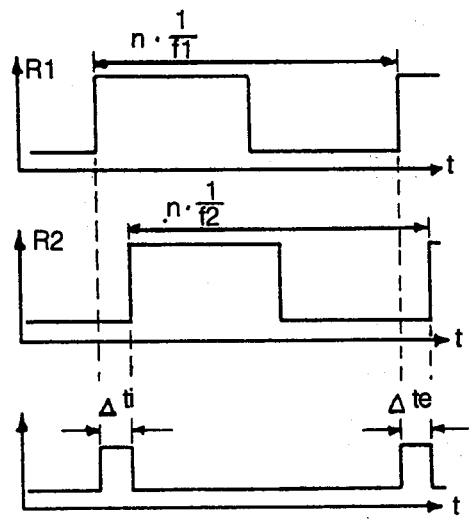
FIG. 1 shows schematically a time diagram of an n-fold period of both quartz oscillators.

A further source of fault is the scattering of the parameters for the integrated circuits and for the tuning capacitors which act on the parabolic coefficients, and the scattering of the inversion points. A scattering of 2° C. constitutes the typical statistical scattering (S), i.e. that 68% of the inversion points are situated within the interval $T_1 \pm 2°$ C. With low frequencies further disadvantages result, in that for measuring the difference frequency $f_1 - f_2$ a time base is necessary, whereby the frequency of one of the two quartz oscillators may be used. In FIG. 1 there are shown the n-fold periods of the two oscillators, R1 and R2, and the difference at the beginning and at the end of the n-fold periods, that is $\Delta t_i$ and $\Delta t_e$, respectively. The difference of the oscillation duration of the n-fold periods is therefore $\Delta t_i - \Delta t_e$.

With each measurement an error of $\Delta t = (1/f_1)$ may occur, if an oscillator 1 has been used as time base. Calculations show that in order to attain a relative accuracy of $2 \times 10^{-7}$, a multi-period of $305s$ is necessary, if $f_1$ amounts to 32 Khz. Hence correction cannot occur until after this time.

As mentioned in the introduction, the object of the present invention is to avoid the above-described disadvantages and to provide an oscillator in which the selection of pairs of quartz crystals before assembly is not necessary and to allow use of quartz oscillators having different parabolic coefficients.

To solve the problem it is necessary to measure the frequencies of both oscillators at three different temperatures to ascertain the three parameters which determine the temperature behaviour of the oscillators, which may be shown by way of a parabola. The statements below apply to quartz oscillators formed like tuning forks.

Assuming that $T_1$, $T_S$ and $T_R$ are the three temperatures and $f_{11}$, $f_{1S}$ and $f_{1R}$ the three corresponding frequencies of oscillator 1, and similarly for oscillator 2, the factors $f_{10}$, $T_1$ and $\beta_1$ for oscillator 1 and similarly for oscillator 2 may be calculated.

The correction can be written in the general form:

$$f(T) = f_1(T) + k(f_2(T) - f_1(T) - \Delta f)^P$$

whereby P is a function of $\beta_1$ and $\beta_2$ and k a function of $T_1$, $T_2$, $\beta_1$, $\beta_2$.

Experiments have shown for $$\left| \frac{\beta_1 - \beta_2}{\beta_1 + \beta_2} \right| \leq 0.1$$

$$k = \frac{-1}{2(\beta_1 + \beta_2)(T_2 - T_1)^2 f_N} \cdot \left(1 - \frac{\beta_1 - \beta_2}{\beta_1 + \beta_2}\right)^2$$

$$P = 2\left(1 + \frac{\beta_1 - \beta_2}{\beta_1 + \beta_2}\right)$$

which may be calculated. Thus, $\Delta f$ is optimal for $\Delta f = f_2(T_1) - f_N$, whereby $f_N$ is the required nominal frequency. The correction functions may be fed into a PROM storage system.

It is easily calculated that, with this general correction function, it is possible, in a temperature interval of $-5°$ C., to obtain a deviation which remains below $2 \times 10^{-7}$ $$\beta_1 = -3.6 \times 10^{-8}/(°C.)^2$$
$$\beta_2 = -4.4 \times 10^{-8}/(°C.)^2$$
$$T_1 = 35° \text{ C. and } T_2 = 5° \text{ C.}$$

If one of the parameters of a quartz is known with sufficient accuracy and the integrated circuits and the tuning capacitors do not scatter extensively, it is possible to effect the measurements at only two different temperatures.

This system may also be used in two oscillators having considerably varying frequencies, whereby after suitable frequency divisions the procedure may be according to the above example.

The difference frequency $f_1 - f_2$ may be measured much more quickly by means of a high frequency oscillator as time base. For example, a 5 MHz oscillator having a symmetrically square signal may be used as time base. Hence the measurement of $f_1 - f_2$ may be carried out with a relative accuracy of $2 \times 10^{-7}$ in one second.

The stability requirements for this high frequency oscillator are low, since to correct the frequency of a low frequency resonator which has a parabolic coefficient of $\beta = -4 \times 10^{-8}$ to an accuracy of $2 \times 10^{-7}$ in a temperature range of $\pm 30°$ C. of the temperature inversion point, an accuracy of 0.5% is sufficient, since $$\beta(\Delta T)^2 = 4 \times 10^{-8} \cdot 900 = -36 \times 10^{-6} \text{ and}$$

$$\frac{2 \times 10^{-7}}{36 \times 10^{-6}} = 0.5\%.$$

This means that an integrated oscillator of the RC type can be used.

A factor E in the frequency thereof also means a factor E for the value $f_1 - f_2$. This makes it possible by adaption of the high frequency oscillator to adapt the value of k.

Figure 3:
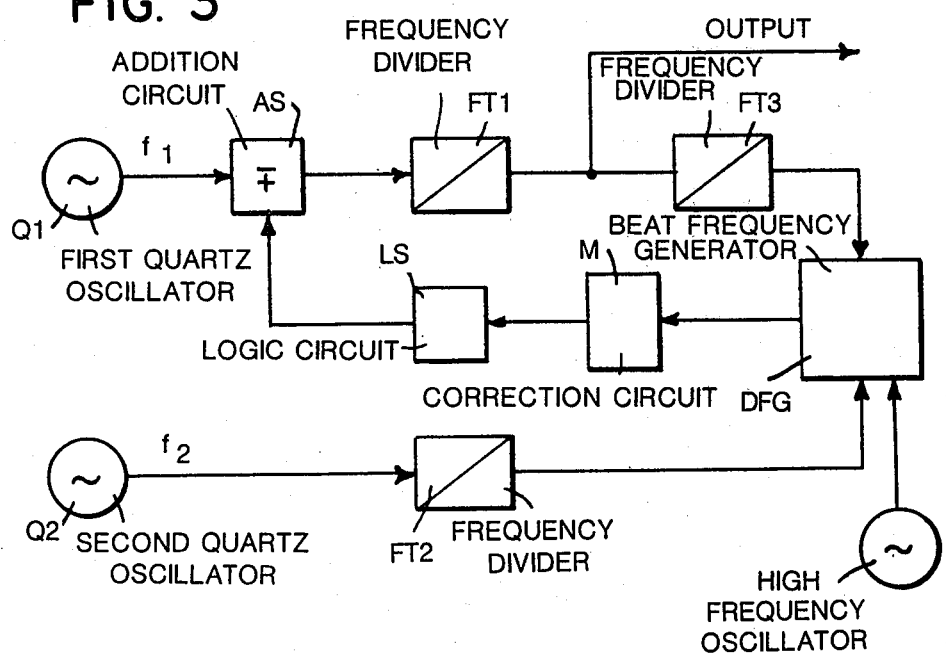
FIG. 3 shows a block diagram of an oscillator circuit in accordance with the invention.

FIG. 3 shows a block diagram of a circuit arrangement. From the first quartz oscillator Q1 the pulses reach an addition circuit AS and subsequently a frequency divider FT1, where the frequency is reduced to 1 Hz and from the output AUS it is supplied to a stepping motor. The pulses also arrive at a further frequency divider FT3 which, dependent upon the requirements on temperature correction, may be omitted, and finally to a beat frequency generator DFG, to which the pulses of the second quartz oscillator Q2 are supplied, via an appropriate frequency divider FT2, so that at a temperature $T_1$ both frequencies are identical. The beat frequency generator DFG for measuring the difference frequency is controlled by an independent high frequency oscillator, in the present case an integrated RC circuit. The difference frequency is supplied to a correction circuit M which has a PROM in which the correction functions (k, P) are stored and subsequently to a logic circuit LS which controls the addition circuit AS in order selectively to suppress or add a pulse from time to time to effect a correction. After division to 1 Hz the pulses reach the output AUS.

By varying the frequency of the RC oscillator it is possible to influence the value of k stored in the PROM and hence to carry out the corrections with a high resolution.

The high frequency oscillator does not have to be constantly in operation, but may moreover be intermittently switched on and off. Thus, the switching times are directed according to the frequency of the temperature fluctuations.

The present oscillator circuit described may be used advantageously wherever a high degree of accuracy and a favourable temperature behaviour is required, and where the volume is small. This applies, for example, to a wrist watch or a film camera.

What I claim is:

1. An oscillator circuit with digital temperature compensation comprising:
   (a) a first low-frequency oscillator;
   (b) a second low-frequency oscillator; and
   (c) a temperature compensation circuit cooperating with the first and second low-frequency oscillators and having:
   (i) a beat frequency generator controlled by an independent high-frequency oscillator connected thereto, for receiving frequency signals generated by said low frequency oscillators, and for generating a difference frequency representing the difference between the frequencies generated by said low frequency oscillators;
   (ii) a correction circuit connected to the beat frequency generator for receiving the difference frequency and generating a correction signal, said correction circuit having a PROM for storing correction functions, and (iii) means for varying the frequency signals of the first low-frequency oscillator, said means connected to the correction circuit and varying the first low-frequency oscillator signal in response to the signal generated by the correction circuit.

2. The oscillator circuit according to claim 1 wherein:
(a) a logic circuit is connected to the PROM for generating a logic signal; and
(b) wherein said frequency varying means contains an addition circuit connected to the logic circuit and the first low-frequency oscillator for receiving and correcting the signal generated by said first low-frequency oscillator by adding to or suppressing said low-frequency oscillator signal in response to said logic signal.

3. The oscillator circuit according to claim 1 wherein said high-frequency oscillator is an integrated RC circuit.

4. The oscillator circuit according the claim 3 wherein said high-frequency oscillator is intermittently switched on and off.

5. The oscillator circuit according to claim 1 wherein said low-frequency oscillators are unmatched quartz crystal oscillators having differing temperature-frequency characteristics and parabolic temperature coefficients, and wherein the temperature-frequency characteristics of each of said low-frequency oscillators are determined by measuring the frequencies produced at each of three different temperatures.

* * * * *